United States Patent
Shimohara (10) Patent No.: US 12,279,464 B2
(45) Date of Patent: Apr. 15, 2025

(54) OPTICAL DETECTION DEVICE

(71) Applicant: HAMAMATSU PHOTONICS K.K., Hamamatsu (JP)

(72) Inventor: Takeshi Shimohara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 341 days.

(21) Appl. No.: 17/163,995

(22) Filed: Feb. 1, 2021

(65) Prior Publication Data

US 2021/0159358 A1 May 27, 2021

Related U.S. Application Data

(63) Continuation-in-part of application No. PCT/JP2020/031322, filed on Aug. 19, 2020.

(30) Foreign Application Priority Data

Aug. 23, 2019 (JP) .................... 2019-152775

(51) Int. Cl.
*H10F 77/40* (2025.01)
*H04N 25/62* (2023.01)
(Continued)

(52) U.S. Cl.
CPC .......... *H10F 77/413* (2025.01); *H04N 25/62* (2023.01); *H10F 39/12* (2025.01); *H10F 55/25* (2025.01); *H10F 77/50* (2025.01); *H10F 77/707* (2025.01)

(58) Field of Classification Search
CPC .......... H01L 31/02327; H01L 27/1462; H01L 27/14625; H01L 31/02366; H10F 77/70;
(Continued)

(56) References Cited

U.S. PATENT DOCUMENTS

2009/0283807 A1* 11/2009 Adkisson .............. H10F 30/221
257/292
2010/0244169 A1* 9/2010 Maeda .................. H10F 77/703
257/E31.127
(Continued)

FOREIGN PATENT DOCUMENTS

CN 101853868 A 10/2010
JP H05-048829 A 2/1993
(Continued)

OTHER PUBLICATIONS

English-language translation of International Preliminary Report on Patentability (IPRP) dated Mar. 3, 2022 that issued in WO Patent Application No. PCT/JP2020/031322.

*Primary Examiner* — Aaron J Gray
(74) *Attorney, Agent, or Firm* — Faegre Drinker Biddle & Reath LLP (57) ABSTRACT

An optical detection device includes an optical semiconductor element having a plurality of light receiving portions and a light transmitting substrate bonded to the optical semiconductor element directly or via only a light transmitting adhesive layer. A surface of the light transmitting substrate on a side opposite to the optical semiconductor element is provided with a first refractive index changing layer having a projecting and recessed structure in which a refractive index continuously changes from a refractive index of air to a refractive index of the light transmitting substrate toward the light transmitting substrate. When a distance between the optical semiconductor element and the first refractive index changing layer is A, a distance between adjacent light receiving portions of the plurality of light receiving portions is B, and a refractive index of the light transmitting substrate to a refractive index of the air is n, $A > B/[2 \tan\{\sin^{-1}(\sin 1°/n)\}]$ is established.

13 Claims, 6 Drawing Sheets

(51) Int. Cl.
*H10F 39/12* (2025.01)
*H10F 55/25* (2025.01)
*H10F 77/50* (2025.01)
*H10F 77/70* (2025.01)

(58) Field of Classification Search
CPC .... H10F 77/707; H10F 77/703; H10F 39/182; H10F 39/18; H10F 39/1825; H10F 39/12
See application file for complete search history.

(56) References Cited

U.S. PATENT DOCUMENTS

| | | | |
|---|---|---|---|
| 2012/0242884 A1 | 9/2012 | Ishiguro et al. | |
| 2013/0032914 A1* | 2/2013 | Iwasaki | H10F 77/413 |
| | | | 257/E31.127 |
| 2017/0110493 A1* | 4/2017 | Yokogawa | H10F 39/8033 |
| 2017/0352695 A1 | 12/2017 | Tsuchiya | |
| 2018/0324339 A1* | 11/2018 | Masuda | H10F 39/8067 |
| 2018/0348415 A1* | 12/2018 | Sasaki | H01L 27/14692 |
| 2019/0190706 A1* | 6/2019 | Stack | H04L 9/0858 |
| 2020/0408598 A1* | 12/2020 | Toda | H10F 39/806 |
| 2022/0085088 A1* | 3/2022 | Toda | G02B 5/008 |

FOREIGN PATENT DOCUMENTS

| | | | | |
|---|---|---|---|---|
| JP | H10-125883 A | 5/1998 | | |
| JP | 2007-201184 A | 8/2007 | | |
| JP | 2010-153512 A | 7/2010 | | |
| JP | 2012-080065 A | 4/2012 | | |
| JP | 2013-33864 A | 2/2013 | | |
| JP | 2016-001633 A | 1/2016 | | |
| JP | 2019-002953 A | 1/2019 | | |
| JP | 2020113630 A | * 7/2020 | ............ | G01J 3/0208 |
| TW | I568009 B | 1/2017 | | |
| TW | 201918723 A | 5/2019 | | |
| WO | WO-2010/116584 A1 | 10/2010 | | |
| WO | WO 2017/077792 A1 | 5/2017 | | |
| WO | WO-2017/094537 A1 | 6/2017 | | |
| WO | WO-2018/110190 A1 | 6/2018 | | |
| WO | WO 2019/069733 A1 | 4/2019 | | |
| WO | WO 2019/159710 A1 | 8/2019 | | |

* cited by examiner

OPTICAL DETECTION DEVICE

CROSS-REFERENCE TO RELATED APPLICATIONS

This application is a Continuation-In-Part application of PCT/JP2020/031322 claiming the benefit of priority of the Japanese Patent Application No. 2019-152775 filed on Aug. 23, 2019, the entire contents of which are incorporated herein by reference.

TECHNICAL FIELD

The present disclosure relates to an optical detection device.

BACKGROUND ART

An optical detection device that includes an optical semiconductor element having a plurality of light receiving portions and a light transmitting substrate bonded to the optical semiconductor element is known. In such an optical detection device, the light transmitting substrate functions as a reinforcing substrate for the thinned optical semiconductor element.

CITATION LIST

Patent Literature

Patent Literature 1: Japanese Unexamined Patent Publication No. H10-125883

SUMMARY OF INVENTION

Technical Problem

In optical detection devices as described above, optical semiconductor elements are becoming thinner and the density of the plurality of light receiving portions is increasing. However, if the distance between adjacent light receiving portions is reduced while a sufficient thickness of the light transmitting substrate is secured, crosstalk that occurs between the adjacent light receiving portions may become a problem.

An object of the present disclosure is to provide an optical detection device capable of reducing the crosstalk that occurs between the adjacent light receiving portions.

Solution to Problem

An optical detection device according to an aspect of the present disclosure includes an optical semiconductor element having a plurality of light receiving portions; and a light transmitting substrate bonded to the optical semiconductor element directly or via only a light transmitting adhesive layer, wherein a surface of the light transmitting substrate on a side opposite to the optical semiconductor element is provided with a first refractive index changing layer having a projecting and recessed structure in which a refractive index continuously changes from a refractive index of air to a refractive index of the light transmitting substrate toward the light transmitting substrate, and wherein, when a distance between the optical semiconductor element and the first refractive index changing layer is A, a distance between adjacent light receiving portions of the plurality of light receiving portions is B, and a refractive index of the light transmitting substrate to a refractive index of the air is n, $A > B/[2 \tan\{\sin^{-1}(\sin 1°/n)\}]$ is established.

Advantageous Effects of Invention

According to the present disclosure, it is possible to provide an optical detection device capable of reducing the crosstalk that occurs between the adjacent light receiving portions.

DESCRIPTION OF EMBODIMENTS

Hereinafter, an optical detection device of the present disclosure will be described in detail with reference to the drawings. In the drawings, the same or corresponding portions will be denoted by the same reference signs and redundant description will be omitted.

Figure 1:
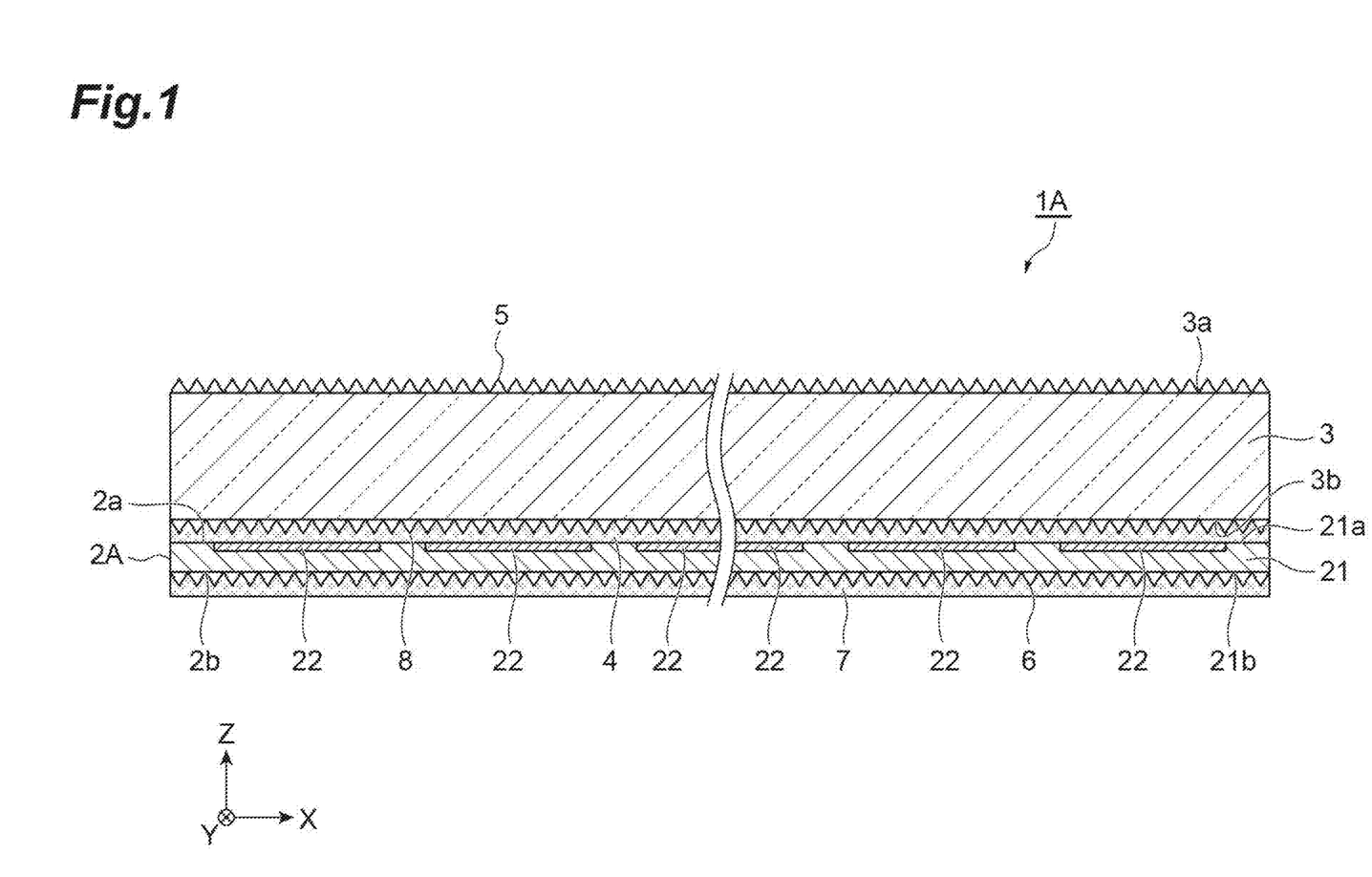
FIG. 1 is a cross-sectional view of an optical detection device according to a first aspect.

As shown in FIG. 1, an optical detection device 1A according to a first aspect includes an optical semiconductor element 2A and a light transmitting substrate 3. The optical semiconductor element 2A has surfaces 2a and 2b that oppose each other in a Z direction. The light transmitting substrate 3 has surfaces 3a and 3b that oppose each other in a Z direction. The light transmitting substrate 3 is disposed on the optical semiconductor element 2A in a state in which the surface 3b faces the surface 2a. Therefore, the surface 2a is a surface of the optical semiconductor device 2A on the light transmitting substrate 3 side, and the surface 2b is a surface of the optical semiconductor element 2A on a side opposite to the light transmitting substrate 3. Further, the surface 3a is a surface of the light transmitting substrate 3 on a side opposite to the optical semiconductor element 2A, and the surface 3b is a surface of the light transmitting substrate 3 on the optical semiconductor element 2A side. In the present aspect, the surface 2a, the surface 2b, the surface 3a, and the surface 3b are parallel to each other. Hereinafter, a direction perpendicular to the Z direction is referred to as an X direction, and a direction perpendicular to the Z direction and the X direction is referred to as a Y direction.

The optical semiconductor element 2A has a semiconductor substrate 21 and a plurality of light receiving portions 22. The semiconductor substrate 21 has surfaces 21a and 21b that oppose each other in a Z direction. The surface 21a is a surface of the semiconductor substrate 21 on the light transmitting substrate 3 side, and the surface 21b is a surface of the semiconductor substrate 21 on a side opposite to the light transmitting substrate 3. The semiconductor substrate 21 is formed of a first conductive type semiconductor material in a rectangular plate shape, for example. As an example, the width of the semiconductor substrate 21 in the X direction is about 15 mm, the width of the semiconductor substrate 21 in the Y direction is about 15 mm, and the width of the semiconductor substrate 21 in the Z direction (that is, the thickness of the semiconductor substrate 21) is about 20 µm.

The plurality of light receiving portions 22 are provided on a portion along the surface 21a of the semiconductor substrate 21. The plurality of light receiving portions 22 are arranged in a matrix in the X direction and the Y direction, for example. Each light receiving portion 22 is, for example, a photodiode (a portion corresponding to a PN junction) configured by forming a second conductive type region on a portion along the surface 21a of the semiconductor substrate 21 made of a first conductive type semiconductor material. As an example, the width of each light receiving portion 22 in the X direction is about 50 µm, and the width of each light receiving portion 22 in the Y direction is about 50 µm. Further, as an example, the distance between adjacent light receiving portions 22 in the X direction is about 1 µm, and the distance between the adjacent light receiving portions 22 in the Y direction is about 1 µm.

The optical semiconductor element 2A is a light receiving element having the surface 2a on the light transmitting substrate 3 side as a light receiving surface. As described above, since the plurality of light receiving portions 22 are provided on the portion along the surface 21a of the semiconductor substrate 21 on the light transmitting substrate 3 side, the optical semiconductor element 2A is a surface incident type light receiving element. Therefore, although not shown, the semiconductor substrate 21 is provided with a plurality of wires (a plurality of through wires or the like) electrically connected to the plurality of light receiving portions 22, and the surface 21b of the semiconductor substrate 21 on a side opposite to the light transmitting substrate 3 is provided with a plurality of pads electrically connected to the plurality of wires. The optical semiconductor element 2A is not limited to that having the above-described configuration as long as it is a surface incident type light receiving element configured such that the plurality of light receiving portions 22 function as a plurality of optical detection channels.

The light transmitting substrate 3 is bonded to the optical semiconductor element 2A with a light transmitting adhesive layer 4. In the present aspect, the light transmitting substrate 3 is a glass substrate and is formed in a rectangular plate shape, for example. As an example, the width of the light transmitting substrate 3 in the X direction is about 15 mm, the width of the light transmitting substrate 3 in the Y direction is about 15 mm, and the width of the light transmitting substrate 3 in the Z direction (that is, the thickness of the light transmitting substrate 3) is about 300 µm to 500 µm.

The adhesive layer 4 is made of, for example, an epoxy resin or the like. As an example, the width of the adhesive layer 4 in the Z direction (that is, the thickness of the adhesive layer 4) is about 50 µm. In the optical detection device 1A, the light transmitting substrate 3 is bonded to the optical semiconductor element 2A via only the light transmitting adhesive layer 4. In the present specification, the expression that the light transmitting substrate is bonded to the optical semiconductor element via only the light transmitting adhesive layer refers to a state in which only the adhesive layer is present between the optical semiconductor element and the light transmitting substrate or a state in which only an adhesive layer and at least one refractive index changing layer, which will be described later, are present between the optical semiconductor element and the light transmitting substrate.

The surface 3a of the light transmitting substrate 3 is provided with a first refractive index changing layer 5. The first refractive index changing layer 5 has a projecting and recessed structure in which a refractive index continuously changes from the refractive index of air to the refractive index of the light transmitting substrate 3 toward the light transmitting substrate 3. The projecting and recessed structure of the first refractive index changing layer 5 is constituted by a plurality of projections or a plurality of recesses and may be referred to as a moth-eye structure. The plurality of projections or the plurality of recesses are arranged at a distance between centers of, for example, about 100 nm to 200 nm. The height of each of the plurality of projections or the depth of each of the plurality of recesses is, for example, about 50 nm to 400 nm. The projecting and recessed structure of the first refractive index changing layer 5 may be a structure called a texture structure. The projecting and recessed structure that is a texture structure has a size similar to that of the projecting and recessed structure that is a moth-eye structure. The first refractive index changing layer 5 prevents the light incident on the surface 3a from the air side from being reflected by the surface 3a and the light incident on the surface 3a from the light transmitting substrate 3 side from being reflected by the surface 3a. The first refractive index changing layer 5 is a layer separate from the light transmitting substrate 3. As an example, the first refractive index changing layer 5 is formed by a film-shaped first refractive index changing layer 5 being attached to the surface 3a of the light transmitting substrate 3.

The surface 21b of the semiconductor substrate 21 is provided with a second refractive index changing layer 6. The second refractive index changing layer 6 has a projecting and recessed structure in which a refractive index continuously changes from the refractive index of a light absorbing layer 7, which will be described later, to the refractive index of the semiconductor substrate 21 toward the semiconductor substrate 21. The projecting and recessed structure of the second refractive index changing layer 6 is constituted by a plurality of projections or a plurality of recesses and may be referred to as a moth-eye structure. The plurality of projections or the plurality of recesses are arranged at a distance between centers of, for example, about 100 nm to 200 nm. The height of each of the plurality of projections or the depth of each of the plurality of recesses is, for example, about 50 nm to 400 nm. The projecting and recessed structure of the second refractive index changing layer 6 may be a structure called a texture structure. The projecting and recessed structure that is a texture structure has a size similar to that of the projecting and recessed structure that is a moth-eye structure. The second refractive index changing layer 6 prevents the light incident on the surface 21b from the semiconductor substrate 21 side from being reflected by the surface 21b. The second refractive index changing layer 6 is a layer separate from the semiconductor substrate 21. As an example, the second refractive index changing layer 6 is formed by a film-shaped second refractive index changing layer 6 being attached to the surface 21b of the semiconductor substrate 21.

The surface 21b of the semiconductor substrate 21 is provided with a light absorbing layer 7 that covers the second refractive index changing layer 6. The light absorbing layer 7 is made of, for example, a black resin or the like.

The light absorbing layer 7 absorbs the light incident on the second refractive index changing layer 6 from the semiconductor substrate 21 side.

The surface 3b of the light transmitting substrate 3 is provided with a third refractive index changing layer 8. The third refractive index changing layer 8 has a projecting and recessed structure in which a refractive index continuously changes from the refractive index of the adhesive layer 4 to the refractive index of the light transmitting substrate 3 toward the light transmitting substrate 3. The projecting and recessed structure of the third refractive index changing layer 8 is constituted by a plurality of projections or a plurality of recesses and may be referred to as a moth-eye structure. The plurality of projections or the plurality of recesses are arranged at a distance between centers of, for example, about 100 nm to 200 nm. The height of each of the plurality of projections or the depth of each of the plurality of recesses is, for example, about 50 nm to 400 nm. The projecting and recessed structure of the third refractive index changing layer 8 may be a structure called a texture structure. The projecting and recessed structure that is a texture structure has a size similar to that of the projecting and recessed structure that is a moth-eye structure. The third refractive index changing layer 8 prevents the light incident on the surface 3b from the adhesive layer 4 side from being reflected by the surface 3b and the light incident on the surface 3b from the light transmitting substrate 3 side from being reflected by the surface 3b. The third refractive index changing layer 8 is a layer separate from the light transmitting substrate 3. As an example, the third refractive index changing layer 8 is formed by a film-shaped third refractive index changing layer 8 being attached to the surface 3b of the light transmitting substrate 3.

In the optical detection device 1A, when the distance between the optical semiconductor element 2A and the first refractive index changing layer 5 is A, the distance between the adjacent light receiving portions 22 in the plurality of light receiving portions 22 is B, and the refractive index of the light transmitting substrate 3 to the refractive index of the air is n, the following formula (1) is established.

$$A > B/[2 \tan\{\sin^{-1}(\sin 1°/n)\}] \quad (1)$$

The above formula (1) means that, in a case in which the light incident on the surface 3a of the light transmitting substrate 3 at an angle of incidence of 1° proceeds toward one light receiving portion 22 of the adjacent light receiving portions 22 (hereinafter simply referred to as □one light receiving portion 22□), when partial light of the light is sequentially reflected by the surface 2a of the optical semiconductor element 2A and the surface 3a of the light transmitting substrate 3, the partial light can proceed toward the other light receiving portion 22 of the adjacent light receiving portions 22 (hereinafter simply referred to as □the other light receiving portion 22□). In a case in which each light receiving portion 22 is, for example, a photodiode (a portion corresponding to a PN junction) configured by forming a second conductive type region on the semiconductor substrate 21 made of a first conductive type semiconductor material, the distance B between the adjacent light receiving portions 22 is the distance between the adjacent second conductive type regions. The distance B between the adjacent light receiving portions 22 may be regarded as the distance between the adjacent depletion layers (the depletion layer in normal driving of the optical semiconductor element 2A).

The above formula (1) will be described in detail with reference to FIG. 2. In the configuration shown in FIG. 2, the light transmitting substrate 3 is directly bonded to the optical semiconductor element 2A, and the first refractive index changing layer 5 is not provided on the surface 3a of the light transmitting substrate 3.

Figure 2:
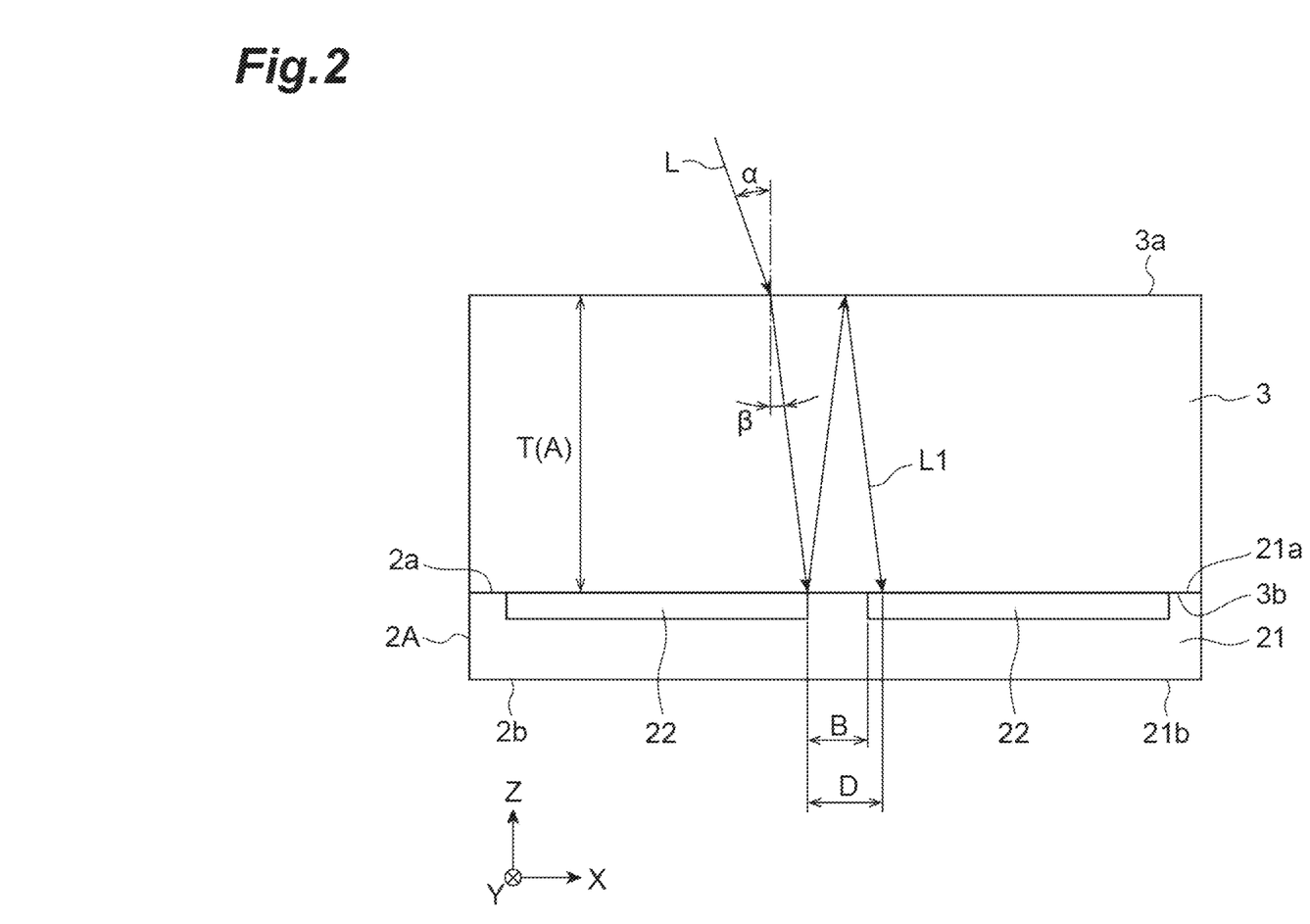
FIG. 2 is a schematic view showing the relationship between the thickness of a light transmitting substrate and the distance which internal reflection light reaches.

In the configuration shown in FIG. 2, a case in which the light L enters the surface 3a of the light transmitting substrate 3 at an angle of incidence α and proceeds in the light transmitting substrate 3 at a refraction angle β, and partial light L1 of the light L is sequentially reflected by the surface 2a of the optical semiconductor element 2A and the surface 3a of the light transmitting substrate 3 will be examined. In that case, when the refractive index of the light transmitting substrate 3 to the refractive index of the air is n, the thickness of the light transmitting substrate 3 is T, and the distance which internal reflection light reaches (the distance between a position at which the light L reaches the surface 2a of the optical semiconductor element 2A and a position at which the partial light L1 reflected by the surface 3a of the light transmitting substrate 3 reaches the surface 2a of the optical semiconductor element 2A) is D, the following formulas (2) and (3) are established.

$$n = \sin α/\sin β \quad (2)$$

$$D = T \times \tan β \times 2 \quad (3)$$

From the above formulas (2) and (3), the following formula (4) can be obtained.

$$D = 2 \times T \times \tan\{(\sin^{-1}(\sin α/n)\} \quad (4)$$

Here, when the distance between the adjacent light receiving portions 22 is B, in a case in which the following formula (5) is established, the partial light L1 of the light L that proceeds toward one light receiving portion 22 is sequentially reflected by the surface 2a of the optical semiconductor element 2A and the surface 3a of the light transmitting substrate 3 and thus can proceed toward the other light receiving portion 22 (hereinafter, this state is referred to as a □state in which crosstalk can occur between the adjacent light receiving portions 22□).

$$D > B \quad (5)$$

From the above formulas (4) and (5), the following formula (6) can be obtained.

$$T > B/[2 \tan\{\sin^{-1}(\sin α/n)\}] \quad (6)$$

In the optical detection device 1A, since the adhesive layer 4 is thin compared with the light transmitting substrate 3, the adhesive layer 4 can be regarded as the same member as the light transmitting substrate 3, and T in the above formula (6) can be replaced with A (the distance between the optical semiconductor element 2A and the first refractive index changing layer 5). Further, in the optical detection device 1A, the aim thereof is to secure a sufficient thickness of the light transmitting substrate 3 and to reduce the distance between the adjacent light receiving portions 22 such that crosstalk can occur between the adjacent light receiving portions 22 even for the light L incident on the light transmitting substrate 3 at an angle of incidence α=1°.

Figure 3:
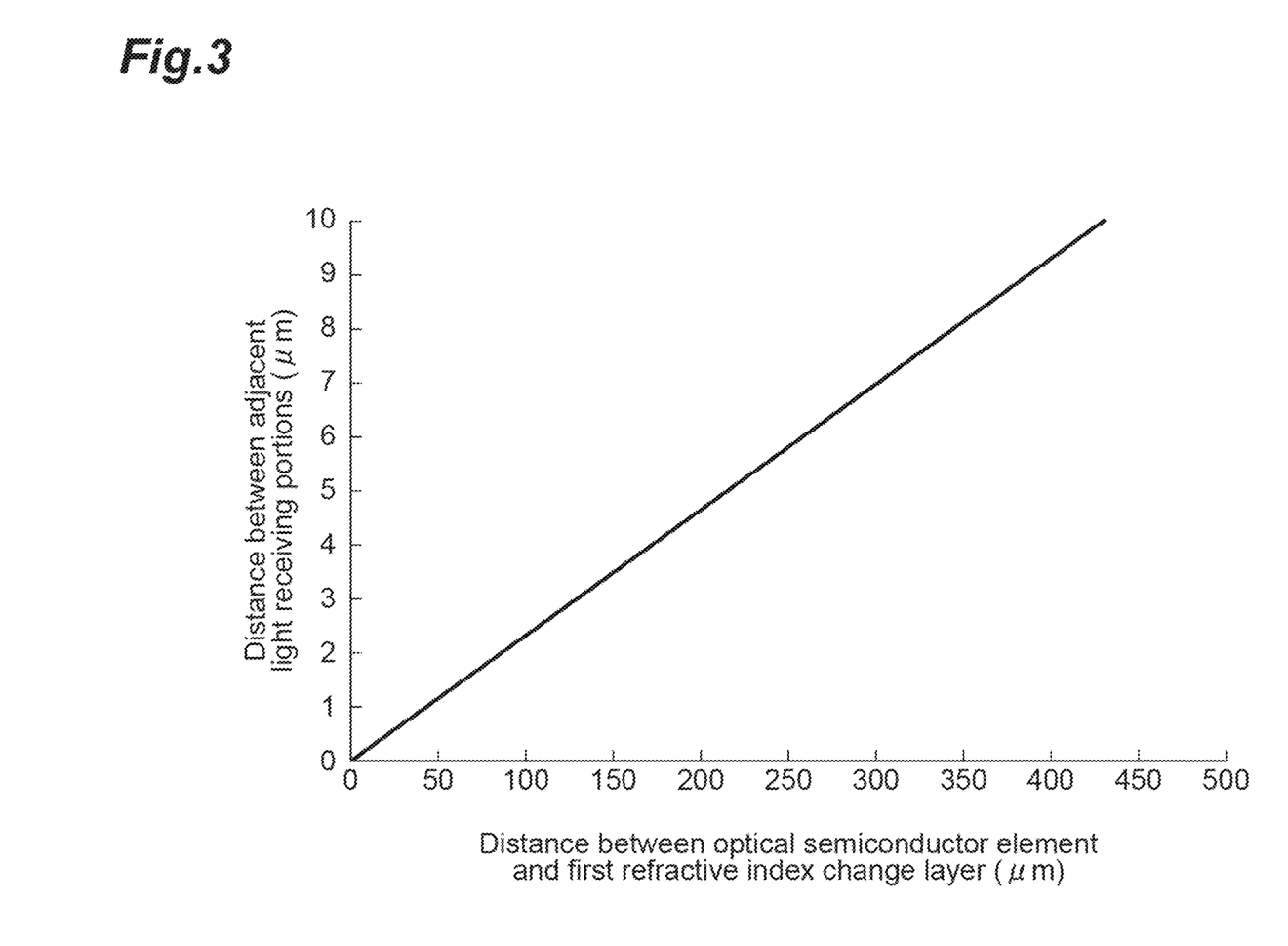
FIG. 3 is a graph showing the relationship between the distance between an optical semiconductor element and a first refractive index changing layer and the distance between adjacent light receiving portions.

Accordingly, in the optical detection device 1A, the above formula (1) is established. FIG. 3 is a graph showing the relationship between the distance between the optical semiconductor element 2A and the first refractive index changing layer 5 and the distance between the adjacent light receiving portions 22. In the graph shown in FIG. 3, a solid straight line indicates $A = B/[2 \tan\{\sin^{-1}(\sin 1°/n)\}]$. Therefore, the distance A and the distance B in the optical detection device 1A are values in a region below the solid straight line.

As described above, in the optical detection device 1A, when the distance between the optical semiconductor element 2A and the first refractive index changing layer 5 is A, the distance between the adjacent light receiving portions 22 is B, and the refractive index of the light transmitting substrate 3 to the refractive index of the air is n, $A > B/[2 \tan\{\sin^{-1}(\sin 1°/n)\}]$ is established. This relational formula means that, in a case in which the light incident on the surface 3a of the light transmitting substrate 3 at an angle of incidence of 1° proceeds toward one light receiving portion 22, when partial light of the light is sequentially reflected by the surface 2a of the optical semiconductor element 2A and the surface 3a of the light transmitting substrate 3, the partial light can proceed toward the other light receiving portion 22. That is, in the optical detection device 1A, it can be said that a sufficient thickness of the light transmitting substrate 3 is secured and the distance between the adjacent light receiving portions 22 is reduced such that crosstalk can occur between the adjacent light receiving portions 22 even for the light incident on the light transmitting substrate 3 at an angle of incidence of 1°. Here, in the optical detection device 1A, the first refractive index changing layer 5 having the projecting and recessed structure in which a refractive index continuously changes from the refractive index of the air to the refractive index of the light transmitting substrate 3 toward the light transmitting substrate 3 is provided on the surface 3a of the light transmitting substrate 3. Therefore, in a case in which the light incident on the surface 3a of the light transmitting substrate 3 at an angle of incidence of 1° proceeds toward one light receiving portion 22, even if partial light of the light is reflected by the surface 2a of the optical semiconductor element 2A, the partial light is less likely to be reflected by the surface 3a of the light transmitting substrate 3, and as a result, the partial light is less likely to proceed toward the other light receiving portion 22. Thus, according to the optical detection device 1A, it is possible to reduce the crosstalk that occurs between the adjacent light receiving portions 22.

In a case in which the light incident on the surface 3a of the light transmitting substrate 3 proceeds toward one light receiving portion 22, when partial light of the light is sequentially reflected by the surface 2a of the optical semiconductor element 2A and the surface 3a of the light transmitting substrate 3, as a means for preventing the partial light from proceeding toward the other light receiving portion 22, it is conceivable to thin the light transmitting substrate 3. However, thinning the light transmitting substrate 3 may lead to problems such as deterioration of the durability of the optical detection device 1A and warpage of the optical detection device 1A. Therefore, in the optical detection device 1A, a configuration capable of securing a thickness of the light transmitting substrate 3 which may not lead to such a problem (that is, a thickness that causes crosstalk to occur between the adjacent light receiving portions 22 even for light incident on the light transmitting substrate 3 at an angle of incidence of 1°) as well as reducing the crosstalk that occurs between the adjacent light receiving portions 22 is realized.

Further, when an optical element such as a lens is disposed in a region between the optical semiconductor element 2A and the light transmitting substrate 3, light incident on the region (light transmitted through the light transmitting substrate 3, light reflected by the semiconductor substrate 21, light from self-light-emission, or the like) may be reflected by the optical element and crosstalk may occur. In the optical detection device 1A, a simple configuration in which the light transmitting substrate 3 is bonded to the optical semiconductor element 2A via only the light transmitting adhesive layer 4 and the optical element that can generate such crosstalk is eliminated is employed.

Further, in the optical detection device 1A, in the optical semiconductor element 2A, the plurality of light receiving portions 22 are provided on a portion along the surface 21a of the semiconductor substrate 21, and the second refractive index changing layer 6 having the projecting and recessed structure in which a refractive index continuously changes from the refractive index of the light absorbing layer 7 to the refractive index of the semiconductor substrate 21 toward the semiconductor substrate 21 is provided on the surface 21b of the semiconductor substrate 21. Accordingly, even if partial light of the light incident on one light receiving portion 22 is transmitted through the semiconductor substrate 21, the partial light is less likely to be reflected by the surface 21b of the semiconductor substrate 21, and as a result, the partial light is less likely to proceed toward the other light receiving portion 22. Therefore, even in a case in which partial light of the light incident on one light receiving portion 22 can be transmitted through the semiconductor substrate 21 as the semiconductor substrate 21 becomes thinner, for example, it is possible to reduce the crosstalk that occurs between the adjacent light receiving portions 22. Further, even if self-light-emission occurs due to the recoupling of electric charges in one light receiving portion 22, the light from self-light-emission is less likely to be reflected by the surface 21b of the semiconductor substrate 21, and as a result, the light from self-light-emission is less likely to proceed toward the light receiving portion 22. Therefore, even in a case in which the light receiving portion 22 has a configuration in which self-light-emission can occur due to the recoupling of electric charges, it is possible to reduce the crosstalk that occurs between the adjacent light receiving portions 22. As the configuration in which self-light-emission can occur due to the recombination of electric charges, there is a configuration of a light receiving portion such as a multi-pixel photon counter (MPPC) or an avalanche photodiode (APD), for example.

Further, in the optical detection device 1A, the light absorbing layer 7 that covers the second refractive index changing layer 6 is provided on the surface 21b of the semiconductor substrate 21. Accordingly, the light incident on the surface 21b of the semiconductor substrate 21 (partial light of the light transmitted through the semiconductor substrate 21, light from self-light-emission, or the like) is absorbed by the light absorbing layer 7, and thus it is possible to prevent the light from being emitted to the outside and re-entering the optical semiconductor element 2A.

Further, in the optical detection device 1A, the light transmitting substrate 3 is bonded to the optical semiconductor element 2A via only the adhesive layer 4, and a third refractive index changing layer 8 having a projecting and recessed structure in which a refractive index continuously changes from the refractive index of the adhesive layer 4 to the refractive index of the light transmitting substrate 3 toward the light transmitting substrate 3 is provided on the surface 3b of the light transmitting substrate 3. Accordingly, the light is less likely to be reflected by the surface 3b of the light transmitting substrate 3, and thus it is possible to more reliably reduce the crosstalk that occurs between the adjacent light receiving portions 22.

Further, in the optical detection device 1A, the light transmitting substrate 3 is a glass substrate. Accordingly, it is possible to easily and reliably obtain the light transmitting substrate 3 that functions as a reinforcing substrate.

Further, in the optical detection device 1A, the first refractive index changing layer 5 is a layer separate from the light transmitting substrate 3, the second refractive index changing layer 6 is a layer separate from the semiconductor substrate 21, and the third refractive index changing layer 8 is a layer separate from the light transmitting substrate 3. Accordingly, it is possible to easily and reliably obtain each of the first refractive index changing layer 5, the second refractive index changing layer 6, and the third refractive index changing layer 8 having a function of continuously changing the refractive index.

The first refractive index changing layer 5 having a function of continuously changing the refractive index prevents the light incident on the surface 3a from the air from being reflected by the surface 3a and thus has a function of improving an incident efficiency of the light. In this respect, the first refractive index changing layer is similar to an antireflection film formed of a dielectric multilayer film. However, since the antireflection film has wavelength dependence, if the antireflection film is designed in accordance with the wavelength of the light to be detected, in a case in which self-light-emission occurs in the light receiving portion 22, it may be not possible to transmit the light from self-light-emission. On the other hand, since the first refractive index changing layer 5 does not have wavelength dependence, it is possible to transmit both the light to be detected and the light from self-light-emission (the light from self-light-emission of which wavelength and emission direction cannot be predicted). In this way, the first refractive index changing layer 5 exhibits an □effect that those skilled in the art cannot predict□ of □it is possible to transmit light regardless of a wavelength and as a result, to reliably reduce the crosstalk that occurs between the adjacent light receiving portions 22.□ The same applies to the second refractive index changing layer 6 and the third refractive index changing layer 8.

An example of a manufacturing method of the optical detection device 1A is as follows. First, a first wafer including a plurality of portions each of which is to be the optical semiconductor element 2A and a second wafer including a plurality of portions each of which is to be the light transmitting substrate 3 are prepared. Subsequently, a film including the first refractive index changing layer 5 and a film including the third refractive index changing layer 8 are attached to both main surfaces of the second wafer. On the other hand, a film including the second refractive index changing layer 6 is attached to a main surface of the first wafer including the surface 21b, and the film is covered with a layer to be the light absorbing layer 7. Subsequently, the first wafer and the second wafer are bonded to each other with the adhesive layer 4 such that the film including the third refractive index changing layer 8 and a main surface of the first wafer including the surface 21a face each other. Subsequently, a plurality of optical detection devices 1A are cut out from the first wafer and the second wafer.

Figure 4:
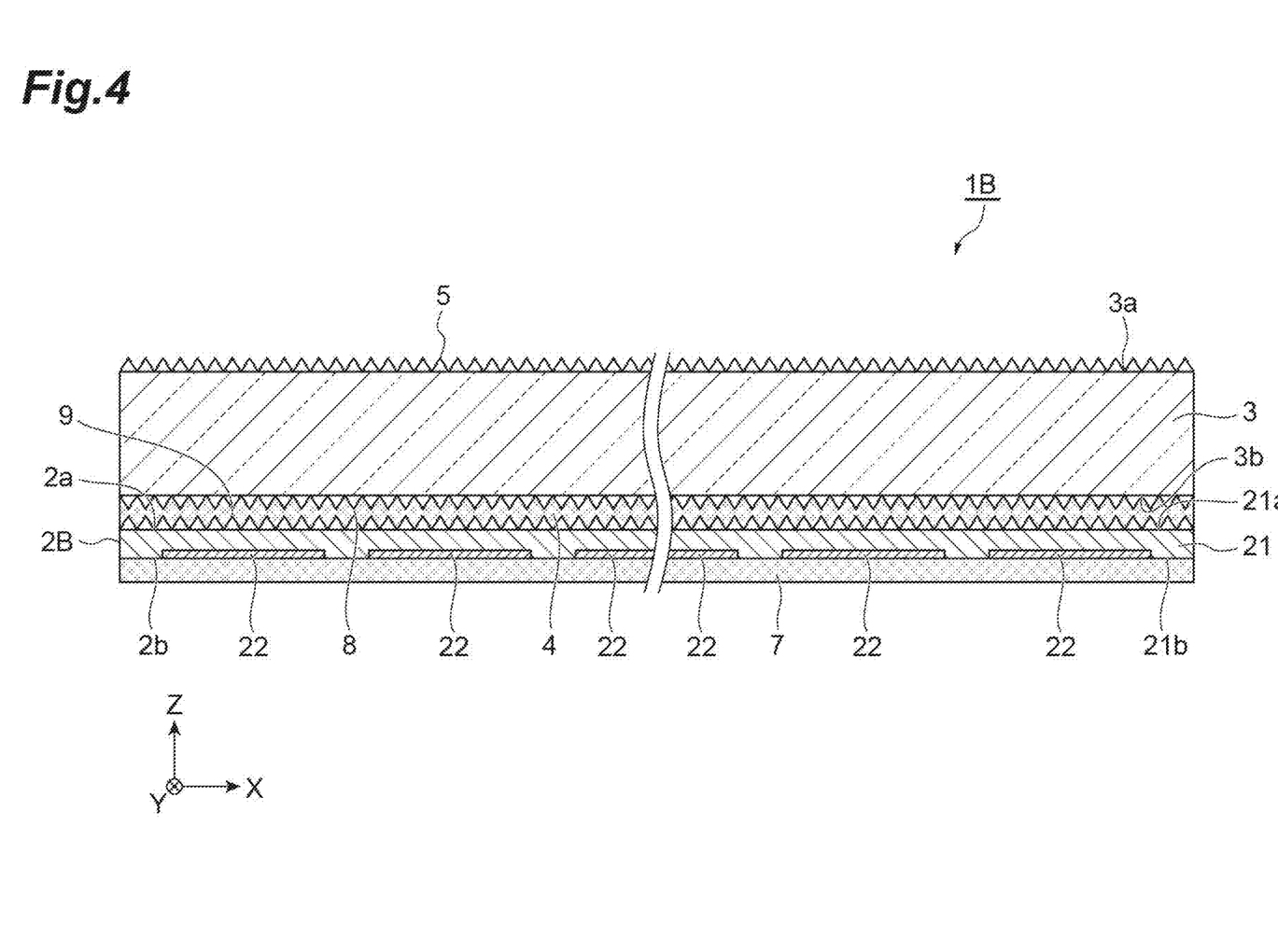
FIG. 4 is a cross-sectional view of an optical detection device according to a second aspect.

As shown in FIG. 4, an optical detection device 1B according to a second aspect is different from the above-described optical detection device 1A according to the first aspect in that an optical semiconductor element 2B is a back surface incident type light receiving element, does not have the second refractive index changing layer 6, and has a fourth refractive index changing layer 9.

In the optical semiconductor element 2B, the plurality of light receiving portions 22 are provided on a portion along the surface 21b of the semiconductor substrate 21. The plurality of light receiving portions 22 are arranged in a matrix in the X direction and the Y direction, for example. Each light receiving portion 22 is, for example, a photodiode (a portion corresponding to a PN junction) configured by forming a second conductive type region on a portion along the surface 21b of the semiconductor substrate 21 made of a first conductive type semiconductor material.

The optical semiconductor element 2B is a light receiving element having the surface 2a on the light transmitting substrate 3 side as a light receiving surface. As described above, since the plurality of light receiving portions 22 are provided on a portion along the surface 21b of the semiconductor substrate 21 on a side opposite to the light transmitting substrate 3 side, the optical semiconductor element 2B is a back surface incident type light receiving element. Therefore, although not shown, the surface 21b of the semiconductor substrate 21 on a side opposite to the light transmitting substrate 3 is provided with a plurality of pads electrically connected to the plurality of light receiving portions 22. The optical semiconductor element 2B is not limited to that having the above-described configuration as long as it is a back surface incident type light receiving element configured such that the plurality of light receiving portions 22 function as a plurality of optical detection channels.

The surface 3a of the light transmitting substrate 3 is provided with a first refractive index changing layer 5. The first refractive index changing layer 5 has a projecting and recessed structure in which a refractive index continuously changes from the refractive index of air to the refractive index of the light transmitting substrate 3 toward the light transmitting substrate 3. The first refractive index changing layer 5 is a layer separate from the light transmitting substrate 3. As an example, the first refractive index changing layer 5 is formed by a film-shaped first refractive index changing layer 5 being attached to the surface 3a of the light transmitting substrate 3.

The surface 3b of the light transmitting substrate 3 is provided with a third refractive index changing layer 8. The third refractive index changing layer 8 has a projecting and recessed structure in which a refractive index continuously changes from the refractive index of the adhesive layer 4 to the refractive index of the light transmitting substrate 3 toward the light transmitting substrate 3. The third refractive index changing layer 8 is a layer separate from the light transmitting substrate 3. As an example, the third refractive index changing layer 8 is formed by a film-shaped third refractive index changing layer 8 being attached to the surface 3b of the light transmitting substrate 3.

The surface 21a of the semiconductor substrate 21 is provided with a fourth refractive index changing layer 9. The fourth refractive index changing layer 9 has a projecting and recessed structure in which a refractive index continuously changes from the refractive index of the adhesive layer 4 to the refractive index of the semiconductor substrate 21 toward the semiconductor substrate 21. The projecting and recessed structure of the fourth refractive index changing layer 9 is constituted by a plurality of projections or a plurality of recesses and may be referred to as a moth-eye structure. The plurality of projections or the plurality of recesses are arranged at a distance between centers of, for example, about 100 nm to 200 nm. The height of each of the plurality of projections or the depth of each of the plurality of recesses is, for example, about 50 nm to 400 nm. The projecting and recessed structure of the fourth refractive index changing layer 9 may be a structure called a texture structure. The projecting and recessed structure that is a texture structure has a size similar to that of the projecting and recessed structure that is a moth-eye structure. The fourth refractive index changing layer 9 prevents the light incident on the surface 21a from the adhesive layer 4 side from being reflected by the surface 21a and the light incident on the surface 21a from the semiconductor substrate 21 side from being reflected by the surface 21a. The fourth refractive index changing layer 9 is a layer separate from the semiconductor substrate 21. As an example, the fourth refractive index changing layer 9 is formed by a film-shaped fourth refractive index changing layer 9 being attached to the surface 21a of the semiconductor substrate 21.

The surface 21b of the semiconductor substrate 21 is provided with a light absorbing layer 7. The light absorbing layer 7 is made of, for example, a black resin or the like. The light absorbing layer 7 absorbs the light incident on the surface 21b from the semiconductor substrate 21 side.

Similar to the optical detection device 1A described above, in the optical detection device 1B, when the distance between the optical semiconductor element 2B and the first refractive index changing layer 5 is A, the distance between the adjacent light receiving portions 22 is B, and the refractive index of the light transmitting substrate 3 to the refractive index of the air is n, $A > B/[2 \tan\{\sin^{-1}(\sin 1°/n)\}]$ is established. This relational formula means that, in a case in which the light incident on the surface 3a of the light transmitting substrate 3 at an angle of incidence of 1° proceeds toward one light receiving portion 22, when partial light of the light is sequentially reflected by the surface 2a of the optical semiconductor element 2B and the surface 3a of the light transmitting substrate 3, the partial light can proceed toward the other light receiving portion 22. That is, in the optical detection device 1B, it can be said that a sufficient thickness of the light transmitting substrate 3 is secured and the distance between the adjacent light receiving portions 22 is reduced such that crosstalk can occur between the adjacent light receiving portions 22 even for the light incident on the light transmitting substrate 3 at an angle of incidence of 1°. Here, in the optical detection device 1B, the first refractive index changing layer 5 having the projecting and recessed structure in which a refractive index continuously changes from the refractive index of the air to the refractive index of the light transmitting substrate 3 toward the light transmitting substrate 3 is provided on the surface 3a of the light transmitting substrate 3. Therefore, in a case in which the light incident on the surface 3a of the light transmitting substrate 3 at an angle of incidence of 1° proceeds toward one light receiving portion 22, even if partial light of the light is reflected by the surface 2a of the optical semiconductor element 2B, the partial light is less likely to be reflected by the surface 3a of the light transmitting substrate 3, and as a result, the partial light is less likely to proceed toward the other light receiving portion 22. Thus, according to the optical detection device 1B, it is possible to reduce the crosstalk that occurs between the adjacent light receiving portions 22. In the optical semiconductor element 2B which is a back surface incident type light receiving element, the distance between the surface 2a and the light receiving portion 22 is sufficiently small compared with the distance A between the optical semiconductor element 2B and the first refractive index changing layer 5, and thus, even if the distance between the surface 2a and the light receiving portion 22 is ignored in the above relational formula, there is substantially no problem. In particular, since the depletion layer expands when the optical semiconductor element 2B is normally driven, even if the distance between the surface 2a and the light receiving portion 22 is ignored in the above relational formula, there is substantially no problem.

In a case in which the light incident on the surface 3a of the light transmitting substrate 3 proceeds toward one light receiving portion 22, when partial light of the light is sequentially reflected by the surface 2a of the optical semiconductor element 2B and the surface 3a of the light transmitting substrate 3, as a means for preventing the partial light from proceeding toward the other light receiving portion 22, it is conceivable to thin the light transmitting substrate 3. However, thinning the light transmitting substrate 3 may lead to problems such as deterioration of the durability of the optical detection device 1B and warpage of the optical detection device 1B. Therefore, in the optical detection device 1B, a configuration capable of securing a thickness of the light transmitting substrate 3 which may not lead to such a problem (that is, a thickness that causes crosstalk to occur between the adjacent light receiving portions 22 even for light incident on the light transmitting substrate 3 at an angle of incidence of 1°) as well as reducing the crosstalk that occurs between the adjacent light receiving portions 22 is realized.

Further, when an optical element such as a lens is disposed in a region between the optical semiconductor element 2B and the light transmitting substrate 3, light incident on the region (light transmitted through the light transmitting substrate 3, light reflected by the semiconductor substrate 21, light from self-light-emission, or the like) may be reflected by the optical element and crosstalk may occur. In the optical detection device 1B, a simple configuration in which the light transmitting substrate 3 is bonded to the optical semiconductor element 2B via only the light transmitting adhesive layer 4 and the optical element that can generate such crosstalk is eliminated is employed.

Further, in the optical detection device 1B, in the optical semiconductor element 2B, the plurality of light receiving portions 22 are provided on a portion along the surface 21b of the semiconductor substrate 21. In this way, even in a case in which the optical semiconductor element 2B has a back surface incident type configuration, it is possible to reduce the crosstalk that occurs between the adjacent light receiving portions 22.

Further, in the optical detection device 1B, the light absorbing layer 7 is provided on the surface 21b of the semiconductor substrate 21. Accordingly, even in a case in which the light incident on the semiconductor substrate 21 can be transmitted through the semiconductor substrate 21, the light is absorbed by the light absorbing layer 7, and thus it is possible to prevent the light from being emitted to the outside and re-entering the optical semiconductor element 2B. Further, even in a case in which the light receiving portion 22 has a configuration in which self-light-emission can occur due to the recoupling of electric charges, light from self-light-emission is absorbed by the light absorbing layer 7, and thus it is possible to prevent the light from self-light-emission from being emitted to the outside and re-entering the optical semiconductor element 2B.

Further, in the optical detection device 1B, the light transmitting substrate 3 is bonded to the optical semiconductor element 2B via only the adhesive layer 4, and a third refractive index changing layer 8 having a projecting and recessed structure in which a refractive index continuously changes from the refractive index of the adhesive layer 4 to the refractive index of the light transmitting substrate 3 toward the light transmitting substrate 3 is provided on the surface 3b of the light transmitting substrate 3. Accordingly, the light is less likely to be reflected by the surface 3b of the light transmitting substrate 3, and thus it is possible to more reliably reduce the crosstalk that occurs between the adjacent light receiving portions 22.

Further, in the optical detection device 1B, the light transmitting substrate 3 is bonded to the optical semiconductor element 2B via only the adhesive layer 4, and a fourth refractive index changing layer 9 having a projecting and recessed structure in which a refractive index continuously changes from the refractive index of the adhesive layer 4 to the refractive index of the semiconductor substrate 21 toward the semiconductor substrate 21 is provided on the surface 21a of the semiconductor substrate 21. Accordingly, the light is less likely to be reflected by the surface 21a of the semiconductor substrate 21, and thus it is possible to more reliably reduce the crosstalk that occurs between the adjacent light receiving portions 22.

Further, in the optical detection device 1B, the light transmitting substrate 3 is a glass substrate. Accordingly, it is possible to easily and reliably obtain the light transmitting substrate 3 that functions as a reinforcing substrate.

Further, in the optical detection device 1B, the first refractive index changing layer 5 is a layer separate from the light transmitting substrate 3, the third refractive index changing layer 8 is a layer separate from the light transmitting substrate 3, and the fourth refractive index changing layer 9 is a layer separate from the semiconductor substrate 21. Accordingly, it is possible to easily and reliably obtain each of the first refractive index changing layer 5, the third refractive index changing layer 8, and the fourth refractive index changing layer 9 having a function of continuously changing the refractive index.

The optical detection device of the present disclosure is not limited to the above-described optical detection devices according to the first and second aspects. For example, the light transmitting substrate 3 may be directly bonded to the optical semiconductor element 2A or the optical semiconductor element 2B. As a means for directly bonding, there is direct bonding (for example, plasma activation bonding, surface activation bonding, atomic diffusion bonding, anode bonding, fusion bonding, hydrophilic bonding, or the like). In a case the light transmitting substrate 3 is directly bonded to the optical semiconductor element 2A or the optical semiconductor element 2B, the adhesive layer 4 and the third refractive index changing layer 8 are unnecessary. Further, when an optical element such as a lens is disposed in a region between the optical semiconductor element 2A or the optical semiconductor element 2B and the light transmitting substrate 3, light incident on the region (light transmitted through the light transmitting substrate 3, light reflected by the semiconductor substrate 21, light from self-light-emission, or the like) may be reflected by the optical element and crosstalk may occur. In the optical detection device 1A, a simple configuration in which the light transmitting substrate 3 is directly bonded to the optical semiconductor element 2A and the optical element that can generate such crosstalk is eliminated is employed. Similarly, in the optical detection device 1B, a simple configuration in which the light transmitting substrate 3 is directly bonded to the optical semiconductor element 2B and the optical element that can generate such crosstalk is eliminated is employed.

Figure 5:
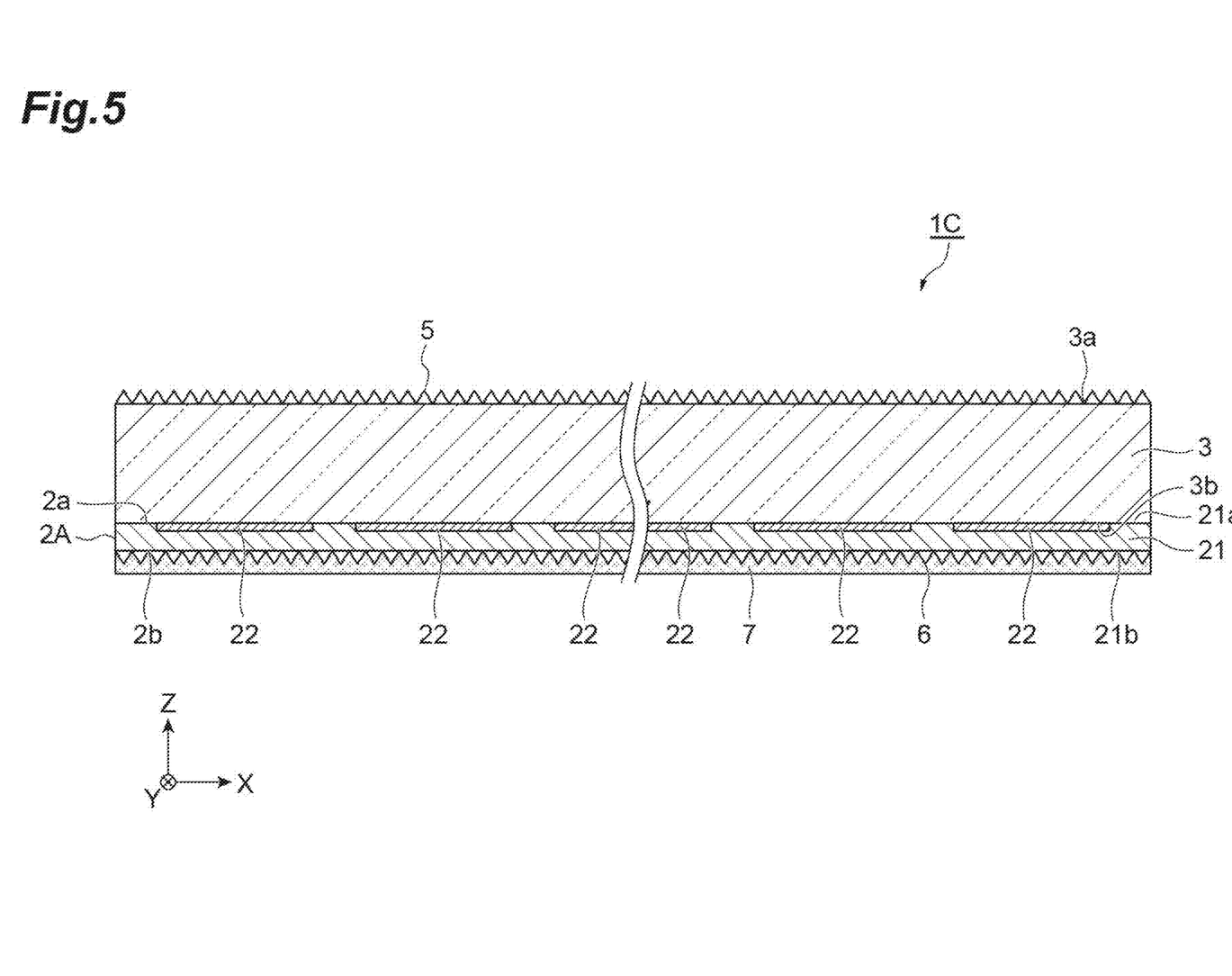
FIG. 5 is a cross-sectional view of an optical detection device according to a third aspect.

Further, as shown in FIG. 5, the light transmitting substrate 3 may be formed on the optical semiconductor element 2A without the adhesive layer therebetween. In an optical detection device 1C according to a third aspect shown in FIG. 5, the light transmitting substrate 3 is formed of a light transmitting resin, for example. An example of a manufacturing method of the optical detection device 1C is as follows. First, a wafer including a plurality of portions each of which is to be the optical semiconductor element 2A is prepared. Subsequently, a first support substrate is attached to a main surface of the wafer including the surface 21a, and a main surface of the wafer including the surface 21b is polished and/or etched, and thus the wafer becomes thinner. Subsequently, a film including the second refractive index changing layer 6 is attached to the main surface of the wafer including the surface 21b, and a second support substrate is attached on the film. Subsequently, the first support substrate is peeled off from the main surface of the wafer including the surface 21a. Subsequently, a resin layer including a plurality of portions each of which is to be the light transmitting substrate 3 is formed on the main surface of the wafer including the surface 21a by a molding method using a light transmitting resin. Subsequently, the second support substrate is peeled off from the film including the second refractive index changing layer 6. Subsequently, a film including the first refractive index changing layer 5 is attached to a main surface of the resin layer including the surface 3a. On the other hand, a layer to be the light absorbing layer 7 is formed on the film including the second refractive index changing layer 6. Subsequently, a plurality of optical detection devices 1C are cutout from the wafer and the resin layer. Thinning the wafer in a state in which the first support substrate is attached to the wafer may not be performed.

Figure 6:
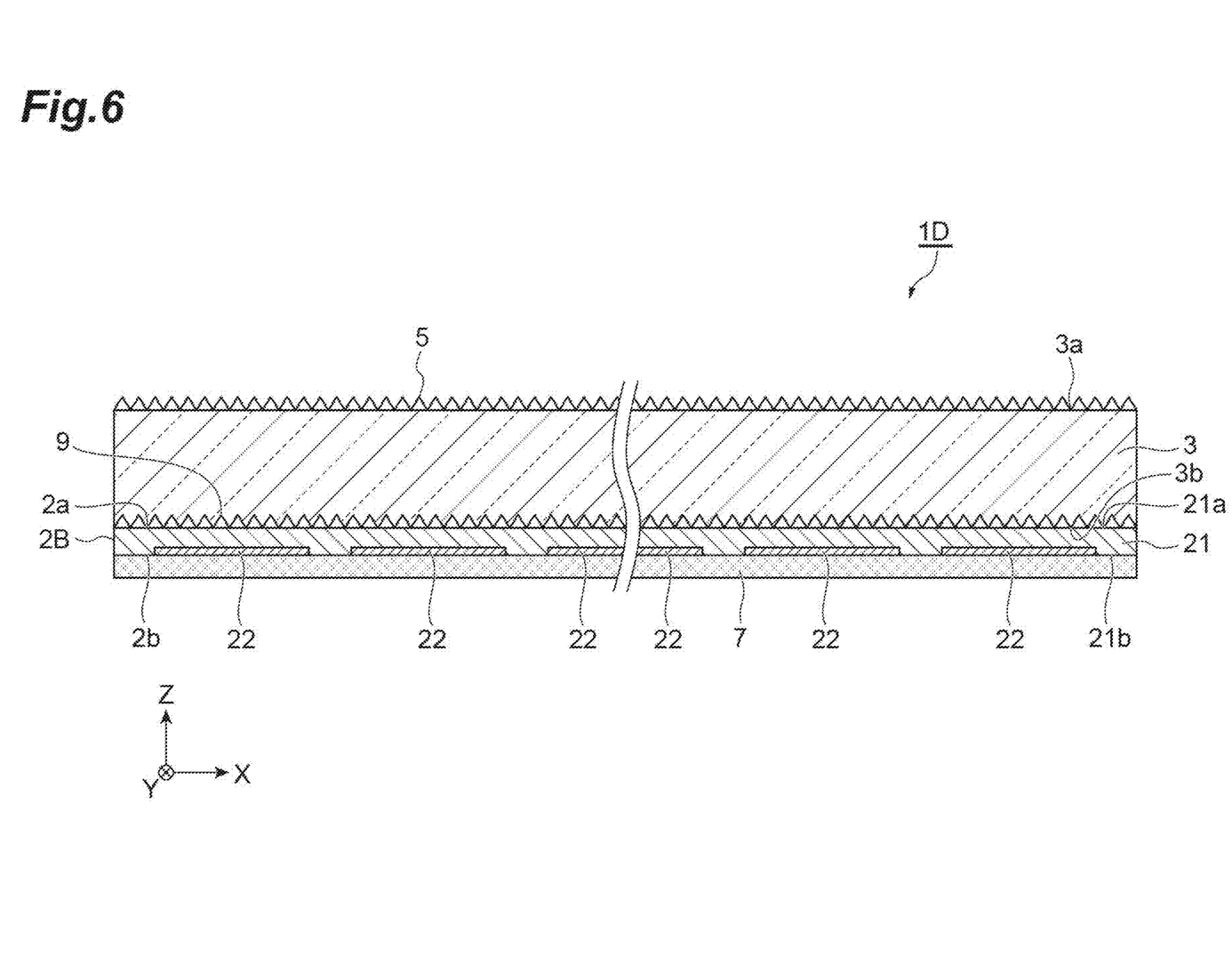
FIG. 6 is a cross-sectional view of an optical detection device according to a fourth aspect.

Further, as shown in FIG. 6, the light transmitting substrate 3 may be formed on the optical semiconductor element 2B without the adhesive layer therebetween. In an optical detection device 1D according to a fourth aspect shown in FIG. 6, the light transmitting substrate 3 is formed of a light transmitting resin, for example. An example of a manufacturing method of the optical detection device 1D is as follows. First, a wafer including a plurality of portions each of which is to be the optical semiconductor element 2B is prepared. Subsequently, a support substrate is attached to a main surface of the wafer including the surface 21b, and a main surface of the wafer including the surface 21a is polished and/or etched, and thus the wafer becomes thinner. Subsequently, a film including the fourth refractive index changing layer 9 is attached to the main surface of the wafer including the surface 21a. Subsequently, a resin layer including a plurality of portions each of which is to be the light transmitting substrate 3 is formed on the film including the fourth refractive index changing layer 9 by a molding method using a light transmitting resin. Subsequently, the support substrate is peeled off from the main surface of the wafer including the surface 21b. Subsequently, a film including the first refractive index changing layer 5 is attached to a main surface of the resin layer including the surface 3a. On the other hand, a layer to be the light absorbing layer 7 is formed on the main surface of the wafer including the surface 21b. Subsequently, a plurality of optical detection devices 1D are cut out from the wafer and the resin layer. Thinning the wafer in a state in which the support substrate is attached to the wafer may not be performed.

Further, the optical semiconductor element 2A or the optical semiconductor element 2B is not limited to the configuration in which the plurality of light receiving portions 22 are arranged in two dimensions, and the plurality of light receiving portions 22 may be arranged in one dimension. Further, the light transmitting substrate 3 may be formed of a light transmitting material other than glass. Further, the light transmitting substrate 3 is not limited to a complete flat plate, and the thicknesses of the light transmission substrate 3 may vary depending on the locations in the light transmission substrate 3.

Further, in each of the optical detection devices 1A, 1B, 1C, and 1D, the first refractive index changing layer 5 may be integrally formed with the light transmitting substrate 3 by the projecting and recessed structure being formed on the surface 3a of the light transmitting substrate 3, for example. In each of the optical detection devices 1A and 1B, the third refractive index changing layer 8 may be integrally formed with the light transmitting substrate 3 by the projecting and recessed structure being formed on the surface 3b of the light transmitting substrate 3, for example. In each of the optical detection devices 1A and 1C, the second refractive index changing layer 6 may be integrally formed with the semiconductor substrate 21 by the projecting and recessed structure being formed on the surface 21b of the semiconductor substrate 21, for example. In each of the optical detection devices 1B and 1D, the fourth refractive index changing layer 9 may be integrally formed with the semiconductor substrate 21 by the projecting and recessed structure being formed on the surface 21a of the semiconductor substrate 21, for example. According to these, it is possible to reduce the number of components of each of the optical detection devices 1A, 1B, 1C, and 1D.

Further, the optical detection device 1A may not be provided with at least one of the second refractive index changing layer 6, the light absorbing layer 7, and the third refractive index changing layer 8. Further, the optical detection device 1B may not be provided with at least one of the light absorbing layer 7, the third refractive index changing layer 8, and the fourth refractive index changing layer 9. Further, the optical detection device 1C may not be provided with at least one of the second refractive index changing layer 6 and the light absorbing layer 7. Further, the optical detection device 1D may not be provided with at least one of the light absorbing layer 7 and the fourth refractive index changing layer 9. In a case in which each of the optical detection devices 1A and 1C is provided with the second refractive index changing layer 6 and each of the light detection devices 1A and 1C is not provided with the light absorbing layer 7, the refractive index of the projecting and recessed structure of the second refractive index changing layer 6 only has to continuously change from the refractive index of a region (a space or another member other than the light absorbing layer 7) in contact with the second refractive index changing layer 6 on a side opposite to the semiconductor substrate 21 to the refractive index of the semiconductor substrate 21 toward the semiconductor substrate 21. Accordingly, even if partial light of the light incident on one light receiving portion 22 is transmitted through the semiconductor substrate 21, the partial light is less likely to be reflected by the surface 21b of the semiconductor substrate 21, and as a result, the partial light is less likely to proceed toward the other light receiving portion 22. Therefore, even in a case in which partial light of the light incident on one light receiving portion 22 can be transmitted through the semiconductor substrate 21 as the semiconductor substrate 21 becomes thinner, for example, it is possible to reduce the crosstalk that occurs between the adjacent light receiving portions 22. Further, even if self-light-emission occurs due to the recoupling of electric charges in one light receiving portion 22, the light from self-light-emission is less likely to be reflected by the surface 21b of the semiconductor substrate 21, and as a result, the light from self-light-emission is less likely to proceed toward the light receiving portion 22. Therefore, even in a case in which the light receiving portion 22 has a configuration in which self-light-emission can occur due to the recoupling of electric charges, it is possible to reduce the crosstalk that occurs between the adjacent light receiving portions 22.

In an optical detection device that includes an optical semiconductor element having a plurality of light receiving portions and a light transmitting substrate bonded to the optical semiconductor element directly or via only a light transmitting adhesive layer, a surface of the light transmitting substrate on a side opposite to the optical semiconductor element may be provided with a first refractive index changing layer having a projecting and recessed structure in which a refractive index continuously changes from a refractive index of air to a refractive index of the light transmitting substrate toward the light transmitting substrate, and when a distance between the optical semiconductor element and the first refractive index changing layer is A, A>50 µm may be established. The distance between the adjacent light receiving portions of the plurality of light receiving portions has become 1 µm or less as the resolution of the optical semiconductor element increases in recent years, and in that case, to reduce the crosstalk that occurs between the adjacent light receiving portions occurs, as shown in FIG. 3, the distance between the optical semiconductor device and the first refractive index changing layer has to be 50 µm or less. However, thinning the light transmitting substrate for that purpose may lead to problems such as deterioration of the durability of the optical detection device and warpage of the optical detection device. Therefore, in this optical detection device, a configuration capable of securing a thickness of the light transmitting substrate which may not lead to such a problem (that is, as a thickness that can establish A>50 µm, a thickness that causes crosstalk to occur between the adjacent light receiving portions even for light incident on the light transmitting substrate at an angle of incidence of 1°) as well as reducing the crosstalk that occurs between the adjacent light receiving portions is realized.

In an optical detection device that includes an optical semiconductor element having a plurality of light receiving portions and a light transmitting substrate bonded to the optical semiconductor element directly or via only a light transmitting adhesive layer, a surface of the light transmitting substrate on a side opposite to the optical semiconductor element may be provided with a first refractive index changing layer having a projecting and recessed structure in which a refractive index continuously changes from a refractive index of air to a refractive index of the light transmitting substrate toward the light transmitting substrate, and when a distance between the optical semiconductor element and the first refractive index changing layer is A, a distance between adjacent light receiving portions of the plurality of light receiving portions is B, and a refractive index of the light transmitting substrate to a refractive index of the air is n, $A > B/[2 \tan\{\sin^{-1}(\sin 5°/n)\}]$ may be established. In this optical detection device, a configuration capable of securing a sufficient thickness of the light transmitting substrate (that is, a thickness that causes crosstalk to occur between the adjacent light receiving portions for light incident on the light transmitting substrate at an angle of incidence of 5° as well as reducing the crosstalk that occurs between the adjacent light receiving portions is realized.

An optical detection device according to an aspect of the present disclosure includes an optical semiconductor element having a plurality of light receiving portions; and a light transmitting substrate bonded to the optical semiconductor element directly or via only a light transmitting adhesive layer, wherein a surface of the light transmitting substrate on a side opposite to the optical semiconductor element is provided with a first refractive index changing layer having a projecting and recessed structure in which a refractive index continuously changes from a refractive index of air to a refractive index of the light transmitting substrate toward the light transmitting substrate, and wherein, when a distance between the optical semiconductor element and the first refractive index changing layer is A, a distance between adjacent light receiving portions of the plurality of light receiving portions is B, and a refractive index of the light transmitting substrate to a refractive index of the air is n, $A > B/[2\tan\{\sin^{-1}(\sin 1°/n)\}]$ is established.

In the optical detection device according to the aspect of the present disclosure, when the distance between the optical semiconductor element and the first refractive index changing layer is A, the distance between the adjacent light receiving portions is B, and the refractive index of the light transmitting substrate to the refractive index of the air is n, $A > B/[2\tan\{\sin^{-1}(\sin 1°/n)\}]$ is established. This relational formula means that, in a case in which the light incident on the surface of the light transmitting substrate on a side opposite to the optical semiconductor element at an angle of incidence of 1° proceeds toward one light receiving portion of the adjacent light receiving portions, when partial light of the light is sequentially reflected by the surface of the optical semiconductor element on the light transmitting substrate side and the surface of the light transmitting substrate on a side opposite to the optical semiconductor element, the partial light can proceed toward the other light receiving portion of the adjacent light receiving portions. That is, in the optical detection device according to the aspect of the present disclosure, it can be said that a sufficient thickness of the light transmitting substrate is secured and the distance between the adjacent light receiving portions is reduced such that crosstalk can occur between the adjacent light receiving portions even for the light incident on the light transmitting substrate 3 at an angle of incidence of 1°. Here, in the optical detection device according to the aspect of the present disclosure, a first refractive index changing layer having a projecting and recessed structure in which a refractive index continuously changes from a refractive index of air to a refractive index of the light transmitting substrate toward the light transmitting substrate is provided on a surface of the light transmitting substrate on a side opposite to the optical semiconductor element. Therefore, in a case in which the light incident on the surface of the light transmitting substrate on a side opposite to the optical semiconductor element at an angle of incidence of 1° proceeds toward one light receiving portion of the adjacent light receiving portions, even if partial light of the light is reflected by the surface of the optical semiconductor element on the light transmitting substrate side, the partial light is less likely to be reflected by the surface of the light transmitting substrate on a side opposite to the optical semiconductor element, and as a result, the partial light is less likely to proceed toward the other light receiving portion of the adjacent light receiving portions. Thus, according to the optical detection device of the aspect of the present disclosure, it is possible to reduce the crosstalk that occurs between the adjacent light receiving portions.

In the optical detection device according to the aspect of the present disclosure, in the optical semiconductor element, the plurality of light receiving portions may be provided on a portion along a surface of a semiconductor substrate on the light transmitting substrate side, a surface of the semiconductor substrate on a side opposite to the light transmitting substrate may be provided with a second refractive index changing layer having a projecting and recessed structure, and a refractive index of the projecting and recessed structure of the second refractive index changing layer may continuously change from a refractive index of a region in contact with the second refractive index changing layer on a side opposite to the semiconductor substrate to a refractive index of the semiconductor substrate toward the semiconductor substrate. Accordingly, even if partial light of the light incident on one light receiving portion of the adjacent light receiving portions is transmitted through the semiconductor substrate, the partial light is less likely to be reflected by the surface of the semiconductor substrate on a side opposite to the light transmitting substrate, and as a result, the partial light is less likely to proceed toward the other light receiving portion of the adjacent light receiving portions. Therefore, even in a case in which partial light of the light incident on one light receiving portion of the adjacent light receiving portions can be transmitted through the semiconductor substrate as the semiconductor substrate becomes thinner, for example, it is possible to reduce the crosstalk that occurs between the adjacent light receiving portions. Further, even if self-light-emission occurs due to the recoupling of electric charges in one light receiving portion of the adjacent light receiving portions, the light from self-light-emission is less likely to be reflected by the surface of the semiconductor substrate on a side opposite to the light transmitting substrate, and as a result, the light from self-light-emission is less likely to proceed toward the other light receiving portion of the adjacent light receiving portions. Therefore, even in a case in which the light receiving portion has a configuration in which self-light-emission can occur due to the recoupling of electric charges, it is possible to reduce the crosstalk that occurs between the adjacent light receiving portions.

In the optical detection device according to the aspect of the present disclosure, the surface of the semiconductor substrate on a side opposite to the light transmitting substrate may be provided with a light absorbing layer that covers the second refractive index changing layer, and a refractive index of the projecting and recessed structure of the second refractive index changing layer may continuously change from a refractive index of the light absorbing layer to a refractive index of the semiconductor substrate toward the semiconductor substrate. Accordingly, the light incident on the surface of the semiconductor substrate on a side opposite to the light transmitting substrate (partial light of the light transmitted through the semiconductor substrate, light from self-light-emission, or the like) is absorbed by the light absorbing layer, and thus it is possible to prevent the light from being emitted to the outside and re-entering the optical semiconductor element.

In the optical detection device according to the aspect of the present disclosure, the light transmitting substrate may be bonded to the optical semiconductor element via only the adhesive layer, and a surface of the light transmitting substrate on the optical semiconductor element side may be provided with a third refractive index changing layer having a projecting and recessed structure in which a refractive index continuously changes from a refractive index of the adhesive layer to a refractive index of the light transmitting substrate toward the light transmitting substrate. Accordingly, the light is less likely to be reflected by the surface of the light transmitting substrate on the optical semiconductor element side, and thus it is possible to more reliably reduce the crosstalk that occurs between the adjacent light receiving portions.

In the optical detection device according to the aspect of the present disclosure, in the optical semiconductor element, the plurality of light receiving portions may be provided on a portion along a surface of a semiconductor substrate on a side opposite to the light transmitting substrate. In this way, even in a case in which the optical semiconductor element has a back surface incident type configuration, it is possible to reduce the crosstalk that occurs between the adjacent light receiving portions.

In the optical detection device according to the aspect of the present disclosure, a surface of the semiconductor substrate on a side opposite to the light transmitting substrate may be provided with a light absorbing layer. Accordingly, even in a case in which the light incident on the semiconductor substrate can be transmitted through the semiconductor substrate, the light is absorbed by the light absorbing layer, and thus it is possible to prevent the light from being emitted to the outside and re-entering the optical semiconductor element. Further, even in a case in which the light receiving portion has a configuration in which self-light-emission can occur due to the recoupling of electric charges, light from self-light-emission is absorbed by the light absorbing layer, and thus it is possible to prevent the light from self-light-emission from being emitted to the outside and re-entering the optical semiconductor element.

In the optical detection device according to the aspect of the present disclosure, the light transmitting substrate may be bonded to the optical semiconductor element via only the adhesive layer, and a surface of the light transmitting substrate on the optical semiconductor element side may be provided with a third refractive index changing layer having a projecting and recessed structure in which a refractive index continuously changes from a refractive index of the adhesive layer to a refractive index of the light transmitting substrate toward the light transmitting substrate. Accordingly, the light is less likely to be reflected by the surface of the light transmitting substrate on the optical semiconductor element side, and thus it is possible to more reliably reduce the crosstalk that occurs between the adjacent light receiving portions.

In the optical detection device according to the aspect of the present disclosure, the light transmitting substrate may be bonded to the optical semiconductor element via only the adhesive layer, and a surface of the semiconductor substrate on the light transmitting substrate side may be provided with a fourth refractive index changing layer having a projecting and recessed structure in which a refractive index continuously changes from a refractive index of the adhesive layer to a refractive index of the semiconductor substrate toward the semiconductor substrate. Accordingly, the light is less likely to be reflected by the surface of the semiconductor substrate on the light transmitting substrate side, and thus it is possible to more reliably reduce the crosstalk that occurs between the adjacent light receiving portions.

In the optical detection device according to the aspect of the present disclosure, the light transmitting substrate may be a glass substrate. Accordingly, it is possible to easily and reliably obtain the light transmitting substrate that functions as a reinforcing substrate.

In the optical detection device according to the aspect of the present disclosure, the first refractive index changing layer may be a layer separate from the light transmitting substrate. Accordingly, it is possible to easily and reliably obtain the first refractive index changing layer having a function of continuously changing the refractive index.

In the optical detection device according to the aspect of the present disclosure, the first refractive index changing layer may be integrally formed with the light transmitting substrate. Accordingly, it is possible to reduce the number of components of the optical detection device.

REFERENCE SIGNS LIST 1A, 1B, 1C, 1D: optical detection device, 2A, 2B: optical semiconductor element, 2a, 2b: surface, 3: light transmitting substrate, 3a, 3b: surface, 4: adhesive layer, 5: first refractive index changing layer, 6: second refractive index changing layer, 7: light absorbing layer, 8: third refractive index changing layer, 9: fourth refractive index changing layer, 21: semiconductor substrate, 21a, 21b: surface, 22: light receiving portion.

The invention claimed is:

1. An optical detection device comprising:
an optical semiconductor element having a plurality of light receiving portions; and
a light transmitting substrate composed of a single member bonded to the optical semiconductor element directly or via only a light transmitting adhesive layer,
wherein a surface of the light transmitting substrate on a side opposite to the optical semiconductor element is provided with a first refractive index changing layer having a projecting and recessed structure in which a refractive index continuously changes from a refractive index of air to a refractive index of the light transmitting substrate toward the light transmitting substrate,
wherein in the projecting and recessed structure, a plurality of projections or a plurality of recesses are arranged at a distance between centers of 100 nm to 200 nm, and a height of each of the plurality of projections or a depth of each of the plurality of recesses is 50 nm to 400 nm,
wherein, a distance between the optical semiconductor element and the first refractive index changing layer is A (A>50 µm), a distance between adjacent light receiving portions of the plurality of light receiving portions is B, a refractive index of the light transmitting substrate to a refractive index of the air is n, and $A > B/[2\tan\{\sin^{-1}(\sin 1°/n)\}]$ is established, and
wherein each of the plurality of light receiving portions includes a configuration of an avalanche photodiode such that self-light-emission can occur due to recoupling of electric charges.

2. The optical detection device according to claim 1,
wherein, in the optical semiconductor element, the plurality of light receiving portions are provided on a portion along a surface of a semiconductor substrate on the light transmitting substrate side,
wherein a surface of the semiconductor substrate on a side opposite to the light transmitting substrate is provided with a second refractive index changing layer having a projecting and recessed structure, and
wherein a refractive index of the projecting and recessed structure of the second refractive index changing layer continuously changes from a refractive index of a region in contact with the second refractive index changing layer on a side opposite to the semiconductor substrate to a refractive index of the semiconductor substrate toward the semiconductor substrate.

3. The optical detection device according to claim 2,
wherein the surface of the semiconductor substrate on a side opposite to the light transmitting substrate is provided with a light absorbing layer that covers the second refractive index changing layer, and
wherein a refractive index of the projecting and recessed structure of the second refractive index changing layer continuously changes from a refractive index of the light absorbing layer to a refractive index of the semiconductor substrate toward the semiconductor substrate.

4. The optical detection device according to claim 2, wherein the light transmitting substrate is bonded to the optical semiconductor element via only the adhesive layer, and
wherein a surface of the light transmitting substrate on the optical semiconductor element side is provided with a third refractive index changing layer having a projecting and recessed structure in which a refractive index continuously changes from a refractive index of the adhesive layer to a refractive index of the light transmitting substrate toward the light transmitting substrate.

5. The optical detection device according to claim 1, wherein, in the optical semiconductor element, the plurality of light receiving portions are provided on a portion along a surface of a semiconductor substrate on a side opposite to the light transmitting substrate.

6. The optical detection device according to claim 5, wherein a surface of the semiconductor substrate on a side opposite to the light transmitting substrate is provided with a light absorbing layer.

7. The optical detection device according to claim 5, wherein the light transmitting substrate is bonded to the optical semiconductor element via only the adhesive layer, and
wherein a surface of the light transmitting substrate on the optical semiconductor element side is provided with a third refractive index changing layer having a projecting and recessed structure in which a refractive index continuously changes from a refractive index of the adhesive layer to a refractive index of the light transmitting substrate toward the light transmitting substrate.

8. The optical detection device according to claim 5, wherein the light transmitting substrate is bonded to the optical semiconductor element via only the adhesive layer, and
wherein a surface of the semiconductor substrate on the light transmitting substrate side is provided with a fourth refractive index changing layer having a projecting and recessed structure in which a refractive index continuously changes from a refractive index of the adhesive layer to a refractive index of the semiconductor substrate toward the semiconductor substrate.

9. The optical detection device according to claim 1, wherein the light transmitting substrate is a glass substrate.

10. The optical detection device according to claim 1, wherein the first refractive index changing layer is a layer separate from the light transmitting substrate.

11. The optical detection device according to claim 1, wherein the first refractive index changing layer is integrally formed with the light transmitting substrate.

12. The optical detection device according to claim 1, wherein the optical semiconductor element has a plurality of through wires.

13. The optical detection device according to claim 12, wherein the thickness of the optical semiconductor element is 20 μm or less.

* * * * *